(12) United States Patent
Kurokawa et al.

(10) Patent No.: US 11,901,837 B2
(45) Date of Patent: Feb. 13, 2024

(54) POWER CONTROL UNIT

(71) Applicant: Hitachi Astemo, Ltd., Hitachinaka (JP)

(72) Inventors: Kazunari Kurokawa, Hitachinaka (JP); Takuma Kato, Hitachinaka (JP); Masahiro Shimada, Haga-gun (JP); Morifumi Shigemasa, Hitachinaka (JP); Akihiro Suzuki, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 219 days.

(21) Appl. No.: 17/464,067

(22) Filed: Sep. 1, 2021

(65) Prior Publication Data
US 2022/0077792 A1 Mar. 10, 2022

(30) Foreign Application Priority Data
Sep. 4, 2020 (JP) .................................. 2020-149208

(51) Int. Cl.
*H02M 7/00* (2006.01)
*H05K 7/20* (2006.01)

(52) U.S. Cl.
CPC ............ *H02M 7/003* (2013.01); *H05K 7/209* (2013.01)

(58) Field of Classification Search
CPC .............................. H02M 7/003; H05K 7/209
See application file for complete search history.

(56) References Cited

U.S. PATENT DOCUMENTS

| | | | |
|---|---|---|---|
| 2013/0176761 A1* | 7/2013 | Hattori | B60L 50/16 363/131 |
| 2018/0350515 A1* | 12/2018 | Okamoto | H01F 27/402 |
| 2019/0260293 A1* | 8/2019 | Kurokawa | G01R 15/207 |

FOREIGN PATENT DOCUMENTS

| | | | | |
|---|---|---|---|---|
| JP | 2014222962 A | 11/2014 | | |
| JP | 5671417 B2 | 2/2015 | | |
| JP | 2015103670 A | 6/2015 | | |
| WO | WO-2014208450 A1 * | 12/2014 | ............ | H01L 23/642 |

OTHER PUBLICATIONS

JPO Notification of Reasons for Rejection for corresponding JP Application No. 2020-149208; dated Sep. 7, 2021.

* cited by examiner

*Primary Examiner* — Gary A Nash
(74) *Attorney, Agent, or Firm* — CANTOR COLBURN LLP

(57) ABSTRACT

A power control unit includes a power device, a heat dissipation member disposed to face the power device with an insulating resin member interposed therebetween, and a plurality of plate-shaped bus bars each of which has one end connected to the power device, in which a plurality of input bus bars connected to an input terminal of the power device are provided as the bus bar, and at least one of the plurality of input bus bars is erected so that a direction along a plate width is aligned with a direction along a normal line of a surface of the heat dissipation member facing the power device, and is disposed with respect to the heat dissipation member with the insulating resin member interposed therebetween.

10 Claims, 9 Drawing Sheets

POWER CONTROL UNIT

CROSS REFERENCE TO RELATED APPLICATIONS

This present invention claims priority under 35 U.S.C. § 119 to Japanese Patent Application No. 2020-149208, filed Sep. 4, 2020, the entire content of which is incorporated herein by reference.

BACKGROUND OF THE INVENTION

Field of the Invention

The present disclosure relates to a power control unit.
Priority is claimed on Japanese Patent Application No. 2020-149208, filed Sep. 4, 2020, the content of which is incorporated herein by reference.

Description of Related Art

A vehicle such as an electric vehicle is provided with a power control unit (PCU) between the battery and the motor. Such a power control unit includes a plurality of power devices (power semiconductor chips) and a power module case for accommodating these power devices.

For example, as disclosed in Japanese Patent Granted Publication No. 5671417, the power control unit is provided with a plate-shaped bus bar that serves as a transmission path. The bus bar is connected to the power device.

SUMMARY OF THE INVENTION

In Japanese Patent Granted Publication No. 5671417, a bus bar is disposed above a cooler. The posture of the bus bar is set so that the front and back surfaces up and down. In Japanese Patent Granted Publication No. 5671417, power devices are disposed on both sides of the bus bar disposed in the center in plan view. Further, the bus bar can be cooled by the cooler together with the power device.

However, in Japanese Patent Granted Publication No. 5671417, a plate-shaped bus bar is disposed so that the front and back surfaces face in the vertical direction. Accordingly, it is necessary to secure a large space for installing the bus bar in plan view. Accordingly, the shape of the cooler in plan view becomes large. Further, the shape of the power control unit in plan view becomes large.

For example, by disposing the bus bar at a position away from the upper area of the cooler, it is conceivable to miniaturize the cooler and further reduce the shape of the power control unit in plan view. However, when the amount of current supplied to the power device increases, the heat generated by the power device increases. Accordingly, when the bus bar is removed from the upper area of the cooler and disposed, the cooling of the bus bar becomes insufficient, and the heat of the power device may be transferred to other circuit elements via the bus bar.

The present disclosure has been made in view of the above-mentioned problems, and in a power control unit including a power device and a bus bar connected to the power device, an object is to suppress the heat of the power device from being transferred to the outside via the bus bar and to reduce the size of the shape of the power control unit in plan view.

The present disclosure employs the following aspects as means for solving the above problems.

A power control unit according to a first aspect adopts a configuration, in which the power control unit includes a power device, a heat dissipation member disposed to face the power device with an insulating resin member interposed therebetween, and a plurality of plate-shaped bus bars each of which has one end connected to the power device, in which a plurality of input bus bars connected to an input terminal of the power device are provided as the bus bar, and at least one of the plurality of input bus bars is erected so that a direction along a plate width is aligned with a direction along a normal line of a surface of the heat dissipation member facing the power device, and is disposed with respect to the heat dissipation member with the insulating resin member interposed therebetween.

In the first aspect, the power control unit according to a second aspect adopts a configuration in which a high-voltage side input bus bar connected to a positive electrode of the power device is provided as the input bus bar, a low-voltage side input bus bar connected to a negative electrode of the power device is provided as the input bus bar, and at least one input bus bar of the high-voltage side input bus bar and the low-voltage side input bus bar is erected so that the direction along the plate width is aligned with the direction along the normal line of the surface of the heat dissipation member facing the power device, and is disposed with respect to the heat dissipation member with the insulating resin member interposed therebetween.

In the first or second aspect, the power control unit according to a third aspect adopts a configuration in which a connection bus bar which connects the plurality of input bus bars is provided as the bus bar.

In the third aspect, the power control unit according to a fourth aspect adopts a configuration in which the plurality of input bus bars and the connection bus bar are integrated.

In the third aspect, the power control unit according to a fifth aspect adopts a configuration in which the connection bus bar is separate from the input bus bar.

In the fifth aspect, the power control unit according to a sixth aspect adopts a configuration in which the power control unit further includes an electrical component to which the other end of the input bus bar is fastened, in which the connection bus bar is fastened together with the other end of the input bus bar.

In the fifth or sixth aspect, the power control unit according to a seventh aspect adopts a configuration in which the power control unit further includes an electrical component to which the other end of the input bus bar is fastened, in which the connection bus bar is supported by the electrical component.

In one of the third to seventh aspects, the power control unit according to an eighth aspect adopts a configuration in which the connection bus bar is provided so that the direction along the plate width is aligned with the direction along the normal line of the surface of the heat dissipation member facing the power device.

In one of the first to eighth aspects, the power control unit according to a ninth aspect adopts a configuration in which the power control unit further includes a power module case holding a plurality of the power devices, in which the power module case has a partition wall disposed between the power device and the power device, and the input bus bar, which is erected so that the direction along the plate width is aligned with the direction along the normal line of the surface of the heat dissipation member facing the power device, is embedded in the partition wall.

In one of the first to ninth aspects, the power control unit according to a tenth aspect adopts a configuration in which the power devices are arranged in a row along one direction in a straight line, the other end of the input bus bar is disposed on one side of the power device in a direction orthogonal to an arrangement direction of the power device, and the other end of the bus bar having one end connected to an output end of the power device is disposed on the other side of the power device in the orthogonal direction.

In the tenth aspect, the power control unit according to an eleventh aspect adopts a configuration in which the power control unit further includes a capacitor connected to the other end of the input bus bar on one side of the power device in the direction orthogonal to the arrangement direction of the power device.

According to each of the above aspects of the present disclosure, the input bus bar is disposed with respect to the heat dissipation member with the insulating resin member interposed therebetween. Accordingly, the heat transferred from the power device to the input bus bar is absorbed by the heat dissipation member and can be prevented from being dissipated to the outside. Further, in the present disclosure, the direction along the plate width of the plate-shaped input bus bar is aligned with the direction along the normal line of the surface of the heat dissipation member facing the power device. Accordingly, the area of the input bus bar in plan view is smaller than that in a case where the front and back surfaces of the input bus bar are parallel to the facing surface. Accordingly, the installation area of the input bus bar in plan view can be suppressed to be small, and the shape of the heat dissipation member in plan view can be reduced. Accordingly, according to each of the above aspects of the present disclosure, in the power control unit including the power device and the bus bar connected to the power device, it is possible to suppress the heat of the power device from being transferred to the outside via the bus bar and to reduce the size of the shape of the power control unit in plan view.

DETAILED DESCRIPTION OF THE INVENTION

Hereinafter, each embodiment of a power control unit according to the present disclosure will be described with reference to the drawings.

First Embodiment

Figure 1:
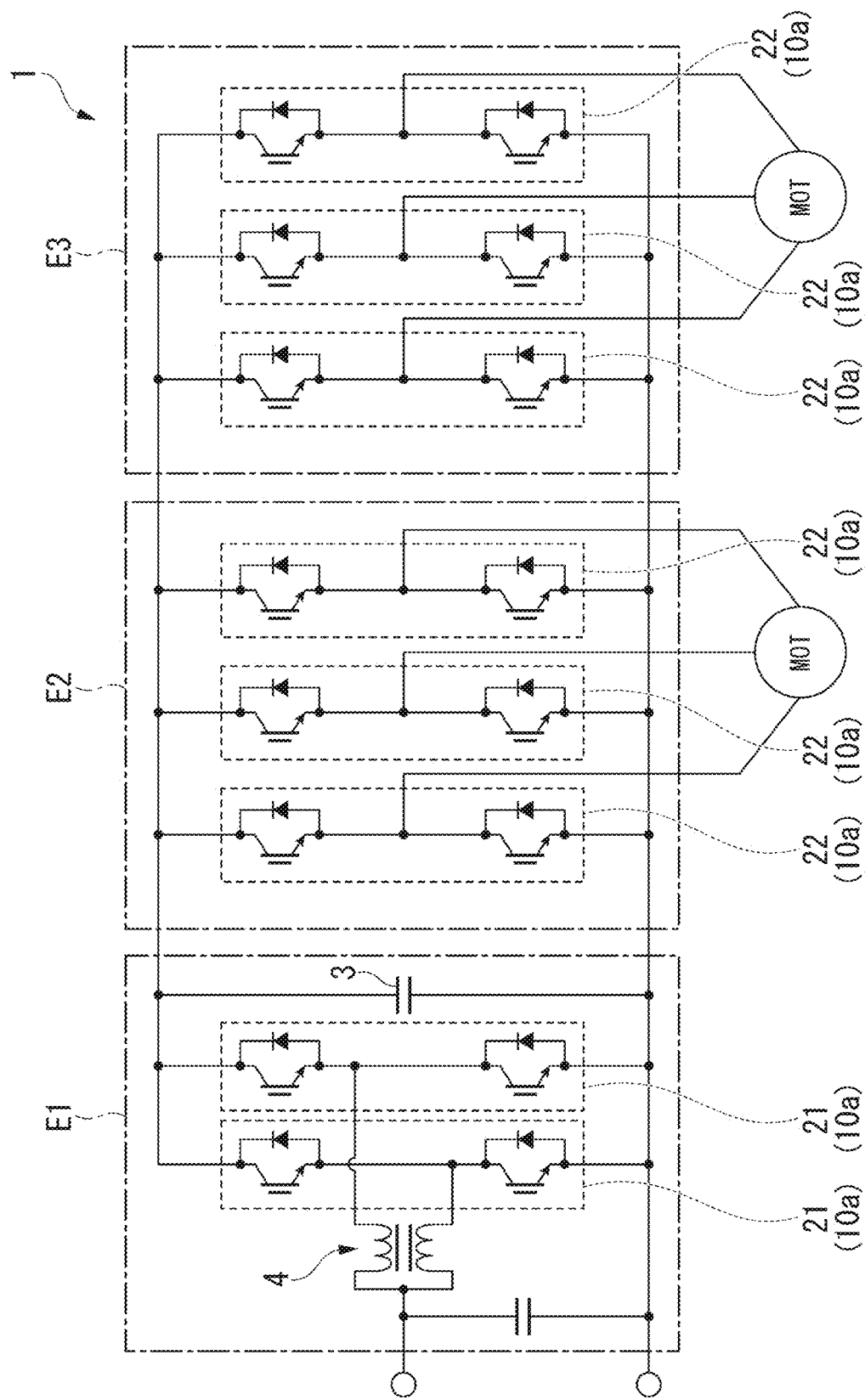
FIG. 1 is a circuit diagram showing a schematic electrical configuration of a power control unit according to a first embodiment of the present disclosure.

FIG. 1 is a circuit diagram showing a schematic electrical configuration of a power control unit 1 of the present embodiment.

The power control unit 1 of the present embodiment is mounted on a vehicle such as an electric vehicle and is provided between a motor (load) (not shown) and a battery. Such power control unit 1 of the present embodiment includes an intelligent power module, a capacitor 3 (electrical component), a reactor 4, a DCDC converter, and a main body case.

The intelligent power module includes a power module 10 (see FIG. 2), a circuit board, or the like. The power module 10 includes a plurality of power devices 10a having a power semiconductor element (see FIG. 2), a power module case 10b holding these power devices 10a (see FIG. 2), a bus bar 10c connected to the power device 10a (see FIG. 3), an insulating resin member 10d (see FIG. 2) for preventing a short circuit of the bus bar 10c, and a water jacket 10e for cooling (heat dissipation member, see FIG. 3), or the like. The circuit board is stacked on the power module 10 and includes a drive circuit for driving the power device 10a or the like.

The capacitor 3 is connected to the intelligent power module and is disposed on the side of the power module 10. The reactor 4 is disposed below the intelligent power module. The DCDC converter is disposed on the side of the reactor 4 and below the intelligent power module. The DCDC converter converts the battery power into a voltage suitable for surrounding electronic devices (electronic devices mounted on a circuit board, or the like). This DCDC converter is omitted in FIG. 1.

The main body case is a case that accommodates the intelligent power module, the capacitor 3, the reactor 4, and the DCDC converter.

As shown in FIG. 1, the power control unit 1 includes a buck-boost circuit E1, a first inverter circuit E2, and a second inverter circuit E3. The buck-boost circuit E1, the first inverter circuit E2, and the second inverter circuit E3 are constituted with the power device 10a, the capacitor 3, the reactor 4, or the like. The power control unit 1 converts the power supplied from the battery into three-phase AC power and supplies the AC power to the motor. Further, the power control unit 1 forwards the regenerative power from the motor to the battery.

As shown in FIG. 1, the buck-boost circuit E1 includes two power devices 10a (a buck-boost circuit power device 21), the capacitor 3 (smoothing capacitor), and the reactor 4. A power transistor is provided in each power device 10a. These power transistors are mounted on a base member B (see FIG. 4), which is a conductor substrate, as a semiconductor chip C (see FIG. 4).

The first inverter circuit E2 includes the three power devices 10a (an inverter circuit power device 22). A power transistor is provided in each power device 10a. These power transistors are mounted on the base member B (see FIG. 4), which is a conductor substrate, as the semiconductor chip C (see FIG. 4).

The second inverter circuit E3 includes the three power devices 10a (the inverter circuit power device 22). A power transistor is provided in each power device 10a. These power transistors are mounted on the base member B (see FIG. 4), which is a conductor substrate, as the semiconductor chip C (see FIG. 4).

Figure 2:
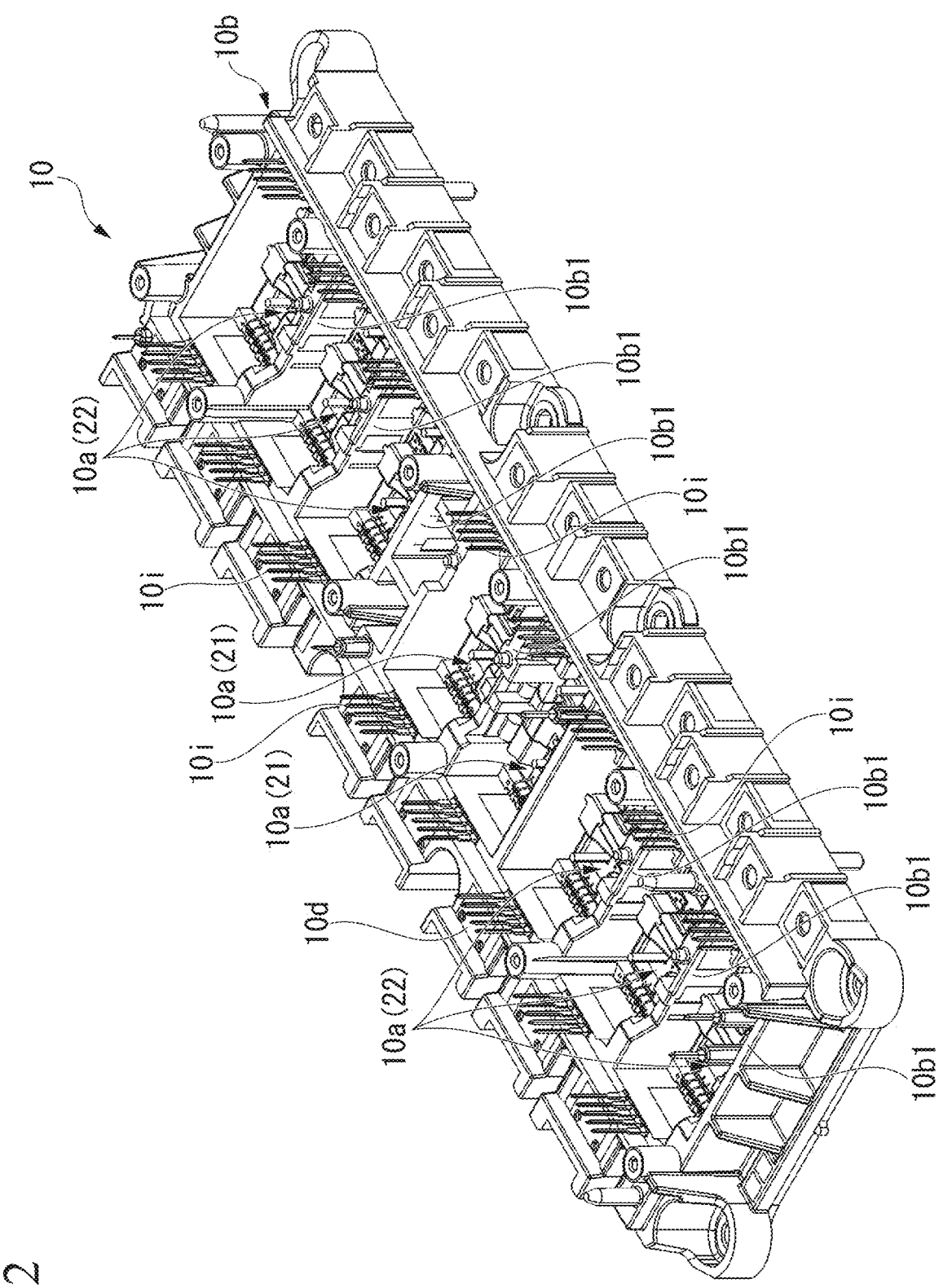
FIG. 2 is a perspective view of a power module included in the power control unit according to the first embodiment of the present disclosure.
Figure 3:
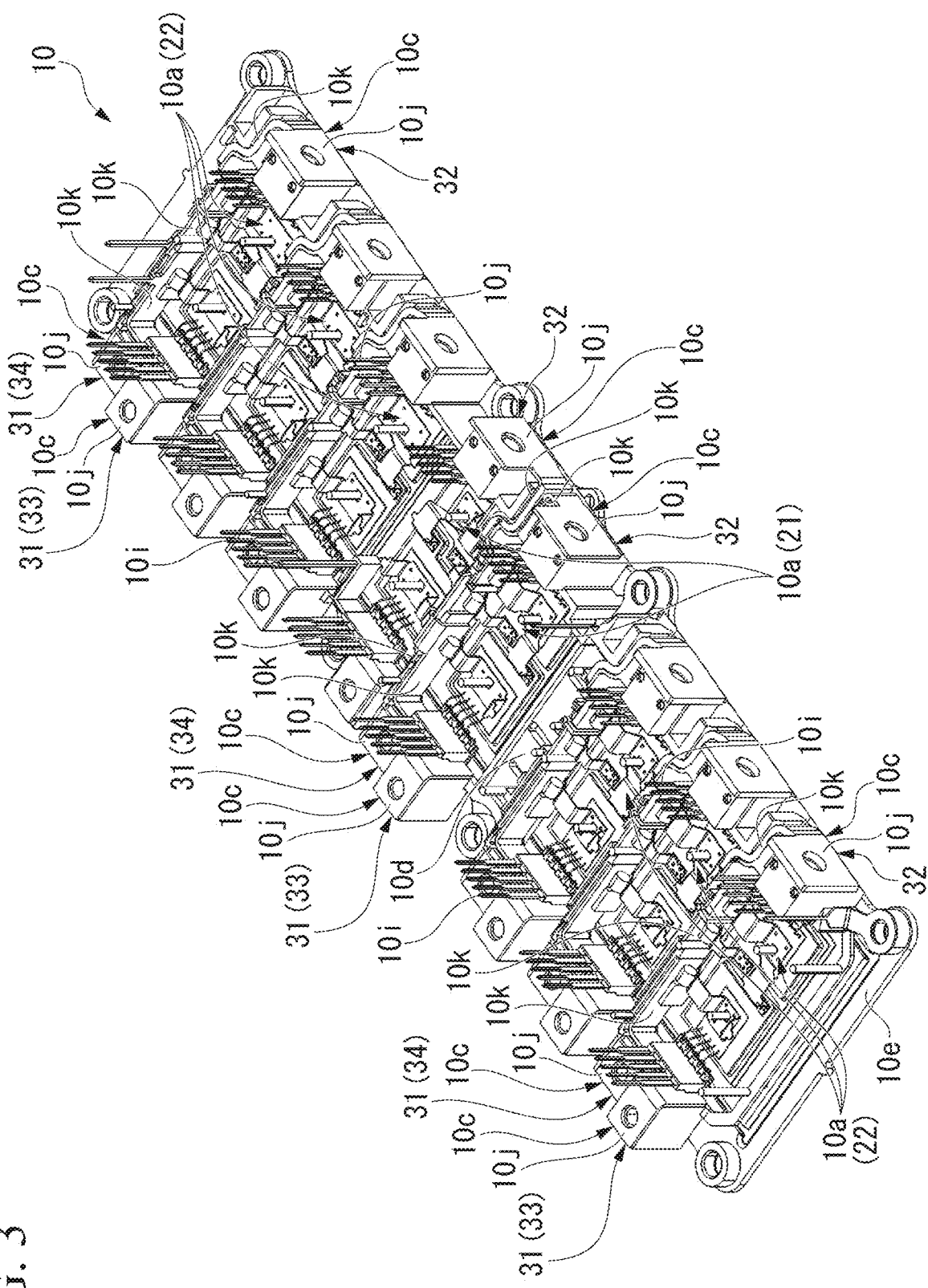
FIG. 3 is a perspective view of the power module included in the power control unit according to the first embodiment of the present disclosure, omitting a power module case.

FIG. 2 is a perspective view of the power module 10 included in the power control unit 1 of the present embodiment. Further, FIG. 3 is a perspective view of the power module 10 in which the power module case 10b is omitted. FIG. 2 is a perspective view of the power module 10 as viewed from the input terminal side. Further. FIG. 3 is a perspective view of the power module 10 as viewed from the output terminal side.

As described above, the power module 10 includes the plurality of (eight in the present embodiment) power devices 10a, the power module case 10b, the bus bar 10c, the insulating resin member 10d, and the water jacket 10e for cooling. In FIG. 2, the water jacket 10e is omitted. Further, in FIG. 3, only the top plate portion of the water jacket 10e is shown.

The power device 10a is a chipped switching device including a switching element driven by a drive circuit provided on a circuit board. The power device 10a forms, for example, an arm of the first inverter circuit E2 and the second inverter circuit E3, and a portion of the buck-boost circuit E1.

Figure 4:
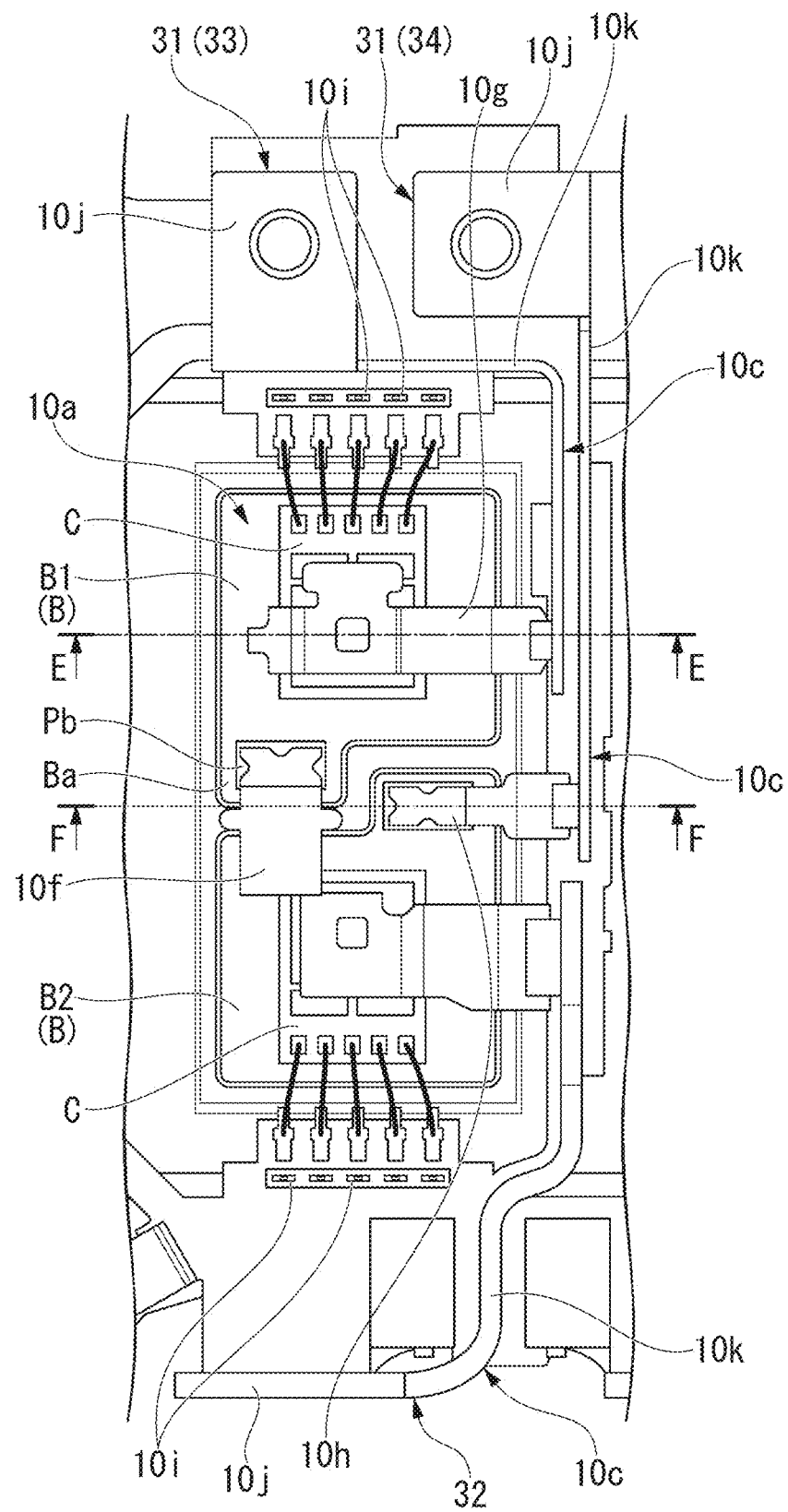
FIG. 4 is an enlarged plan view of one power device included in the power control unit according to the first embodiment of the present disclosure.

FIG. 4 is an enlarged plan view of one power device 10a. Also in FIG. 4, the power module case 10b is omitted as in FIG. 3. As shown in this figure, the power device 10a includes two base members B (first conductor substrate B1 and second conductor substrate B2) and the semiconductor chip C mounted on each base member B. The base member B is a conductor substrate on which a wire and a connection pad are formed. The first conductor substrate B1 is provided with a connection pad Pb connected to the second conductor substrate B2 via the semiconductor chip C. In the first conductor substrate B1, the portion Ba on which the connection pad Pb is provided is projected toward the second conductor substrate B2.

The power module 10 includes a central lead frame 10f. The connection pad Pb of the first conductor substrate B1 and the semiconductor chip C mounted on the second conductor substrate B2 are connected by the central lead frame 10f. The central lead frame 10f is joined to the connection pad Pb and the semiconductor chip C by soldering.

Further, the power module 10 includes a low-voltage side lead frame 10g and a high-voltage side lead frame 10h. The semiconductor chip C mounted on the first conductor substrate B1 and the bus bar 10c are connected by the low-voltage side lead frame 10g. The low-voltage side lead frame 10g is joined to the semiconductor chip C and the bus bar 10c by soldering. Further, the semiconductor chip C mounted on the second conductor substrate B2 and the bus bar 10c are connected by the high-voltage side lead frame 10h. The high-voltage side lead frame 10h is joined to the semiconductor chip C and the bus bar 10c by soldering.

Each semiconductor chip C is connected to a lead pin 10i provided in the power module case 10b by a lead wire. The lead pin 10i is connected to the circuit board. The lead pin 10i is provided to extend in the vertical direction.

In the present embodiment, as shown in FIGS. 2 and 3, such power devices 10a are linearly arranged in a straight line along one direction. In the present embodiment, the inverter circuit power devices 22 are arranged so that the buck-boost circuit power device 21 is interposed therebetween. That is, the three inverter circuit power devices 22 are disposed at each end of the power device 10a in the arrangement direction, and the two buck-boost circuit power devices 21 are disposed adjacent to each other in the center.

The power module case 10b is made of an insulating resin material. Further, the power module case 10b is formed in a substantially rectangular shape with the arrangement direction of the power device 10a as the longitudinal direction. The power module case 10b has an accommodating recess for accommodating the power device 10a. Such power module case 10b holds the plurality of power devices 10a and has a partition wall 10b1 that embeds a bus bar main body portion 10k of an input bus bar 31 as described above.

The bus bar 10c is a plate-shaped conductive portion that connects the battery or motor and the power device 10a. The bus bar 10c has an external connection terminal portion 10j and the bus bar main body portion 10k. A plurality of bus bars 10c are provided for each power device 10a, and one end thereof is connected to the power device 10a. The external connection terminal portion 10j is a portion used as a terminal portion for connecting the power module 10 to the outside. The bus bar main body portion 10k is provided to be routed from the external connection terminal portion 10j to the lead frame (the central lead frame 10f, the low-voltage side lead frame 10g, and the high-voltage side lead frame 10h) connected to the power device 10a.

In the present embodiment, the power module 10 includes the input bus bar 31 and an output bus bar 32 as the bus bar 10c. The input bus bar 31 is the bus bar 10c that connects the capacitor 3 and the input terminal of the power device 10a. Further, the input bus bar 31 is connected to the battery via the output end of the buck-boost circuit E1. The input bus bar 31 (the input bus bar 31 connected to the negative electrode of the power device 10a) connected to the low voltage terminal of the buck-boost circuit E1 (battery) is referred to as a low-voltage side input bus bar 33, and the input bus bar 31 (the input bus bar 31 connected to the positive electrode of the power device 10a) connected to the high voltage terminal of the buck-boost circuit E1 (battery) is referred to as a high-voltage side input bus bar 34.

Figure 5A:
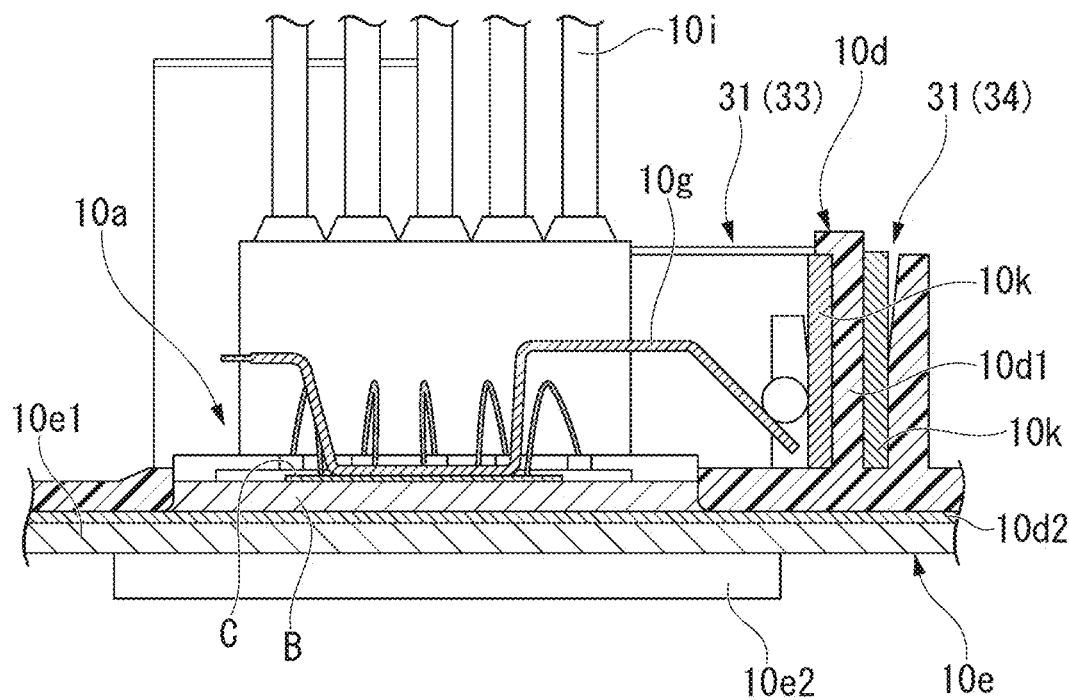
FIG. 5A is a cross-sectional view taken along the line E-E of FIG. 4.
Figure 5B:
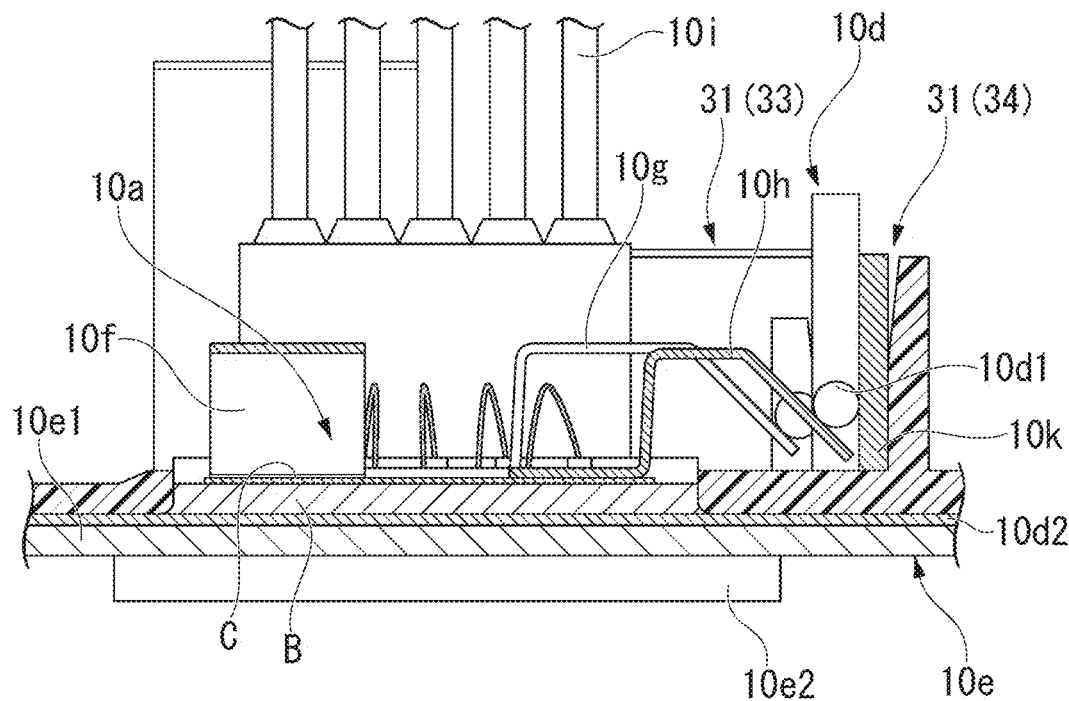
FIG. 5B is a cross-sectional view taken along the line F-F of FIG. 4.

FIG. 5A is a cross-sectional view taken along the line E-E of FIG. 4. Further, FIG. 5B is a cross-sectional view taken along the line F-F of FIG. 4. In FIGS. 5A and 5B, the power module case 10b omitted in FIG. 4 is shown. As shown in FIGS. 4, 5A and 5B, the input bus bar 31 is provided so that the plate width direction (the width direction orthogonal to the current flowing direction and the plate thickness direction) of the bus bar main body portion 10k is aligned with the vertical direction. In the present embodiment, the top surface of the water jacket 10e (atop surface 10e1 of the top plate portion) is the facing surface with respect to the power device 10a. The facing surface is a horizontal plane. Accordingly, the input bus bar 31 is erected so that the direction along the plate width is aligned with the direction along the normal line of the surface of the water jacket 10e facing the power device 10a. In such input bus bar 31, the bus bar main body portion 10k is erected with respect to the water jacket 10e as described above. Accordingly, the installation space of the input bus bar 31 in plan view is extremely smaller than that in a case where the bus bar main body portion 10k is placed flat in parallel with the facing surface of the water jacket 10e.

In the present embodiment, the bus bar main body portion 10k of the input bus bar 31 is erected at each spacing between the power device 10a and the power device 10a having a rectangular shape in plan view as described above. Accordingly, it is not necessary to adopt a configuration in which the input bus bar 31 is placed flat in parallel with the facing surface of the water jacket 10e with respect to the power device 10a, and the plurality of power devices 10a are arranged on both sides of the input bus bar 31 that are placed flat. Accordingly, the installation space of the input bus bar 31 in plan view can be reduced, and the shape of the power module 10 and further the power control unit 1 in plan view can be reduced.

As shown in FIG. 5A, the bus bar main body portion 10k of the low-voltage side input bus bar 33 and the bus bar main body portion 10k of the high-voltage side input bus bar 34 are disposed in parallel with a vertical wall 10d1 of the insulating resin member 10d interposed therebetween. The bus bar main body portion 10k of the low-voltage side input bus bar 33 connected to the one inverter circuit power device 22 and the bus bar main body portion 10k of the high-voltage side input bus bar 34 form a pair and are disposed in parallel with each other such that the vertical wall 10d1 of the insulating resin member 10d is interposed therebetween.

Further, the heat capacity of the input bus bar 31 is preferably large to suppress the heat generated by the power device 10a from being transferred to the capacitor 3. Accordingly, it is preferable that the lower end of the bus bar main body portion 10k of the input bus bar 31 is as close as possible to the facing surface of the water jacket 10e. Further, it is preferable that the upper end of the bus bar main body portion 10k of the input bus bar 31 is kept away from the water jacket 10e as much as possible. Accordingly, as shown in FIG. 5A, the lower end of the bus bar main body portion 10k of the input bus bar 31, for example, is disposed closer to the water jacket 10e than the height of the top surface of the power device 10a. Further, as shown in FIG. 5A, the upper end of the bus bar main body portion 10k of the input bus bar 31, for example, is disposed higher than the upper end position of the lead frame (the central lead frame 10f, the low-voltage side lead frame 10g, and the high-voltage side lead frame 10h).

The bus bar main body portion 10k of the input bus bar 31 is disposed with respect to the water jacket 10e with only a bottom portion 10d2 of the insulating resin member 10d interposed therebetween. Accordingly, in the present embodiment, the heat of the input bus bar 31 easily escapes with respect to the water jacket 10e. Accordingly, the heat transferred from the power device 10a to the input bus bar 31 is absorbed by the water jacket 10e and can be prevented from being dissipated to the outside.

Figure 6:
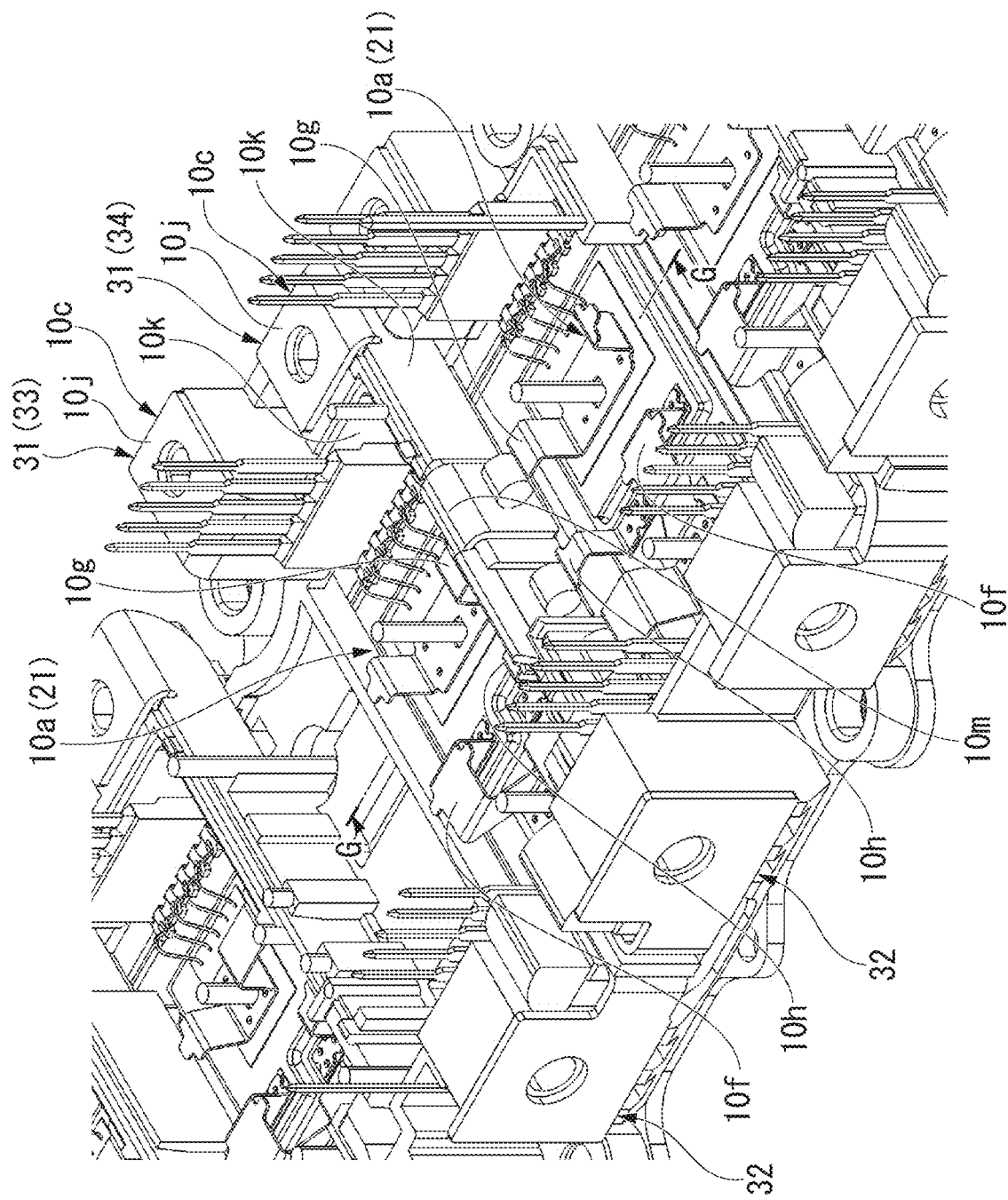
FIG. 6 is an enlarged perspective view including a main portion of two buck-boost circuit power devices included in the power control unit according to the first embodiment of the present disclosure.
Figure 7:
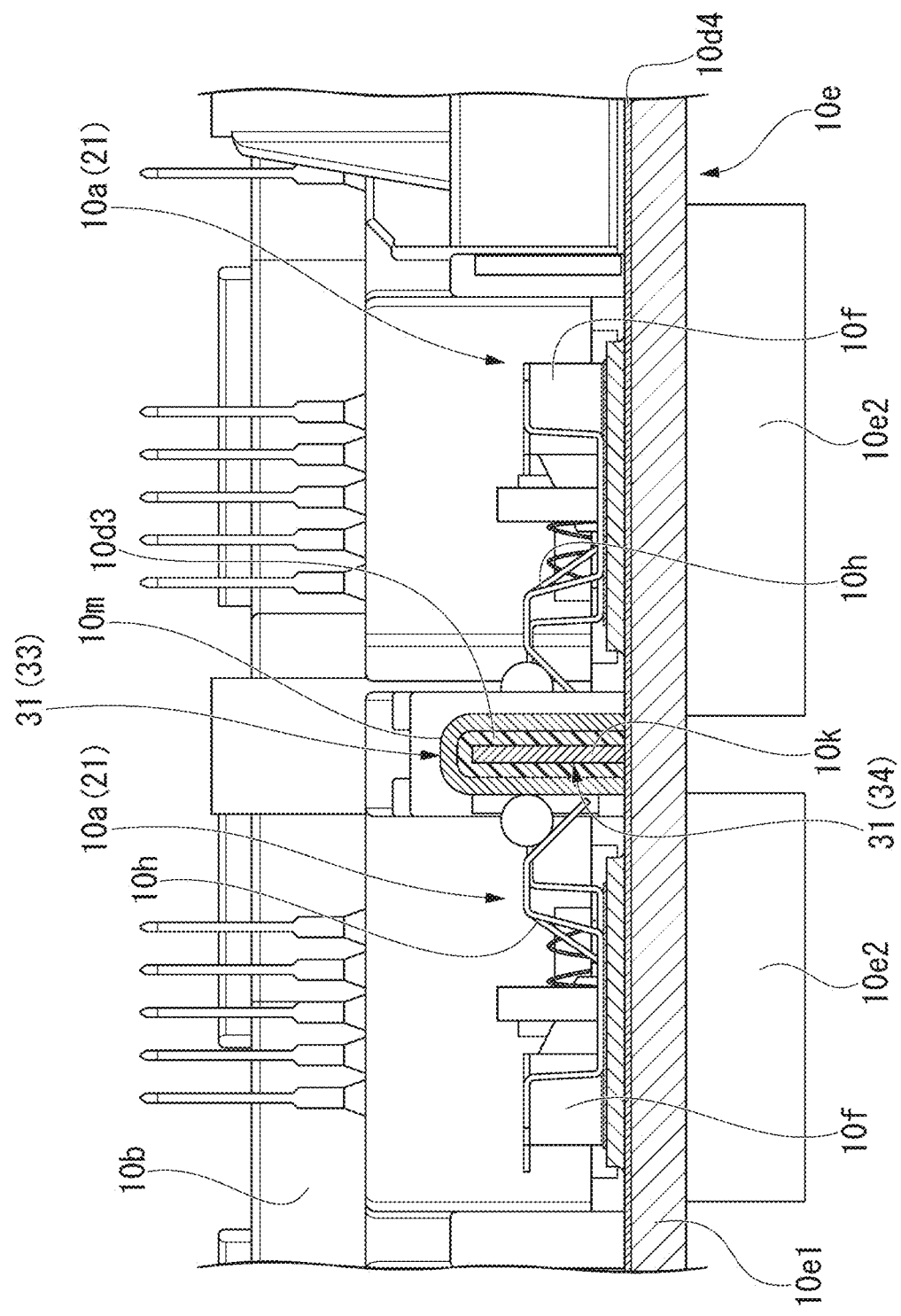
FIG. 7 is a cross-sectional view taken along the line G-G of FIG. 6.

FIG. 6 is an enlarged perspective view including a main portion of two buck-boost circuit power devices 21. Also in FIG. 6, the power module case 10b is omitted. Further, FIG. 7 is a cross-sectional view taken along the line G-G of FIG. 6. FIG. 7 shows the power module case 10b. As shown in these figures, the low-voltage side input bus bar 33 is shared by these two buck-boost circuit power devices 21. Further, in these two buck-boost circuit power devices 21, the high-voltage side input bus bar 34 is also shared. That is, in the present embodiment, the power module 10 includes a common input bus bar that is connected to the two power devices 10a straddling a covering wall portion 10d3.

As shown in FIG. 7, the covering wall portion 10d3 (wall portion) of the insulating resin member 10d is provided to cover the high-voltage side input bus bar 34 connected to one of the buck-boost circuit power devices 21. Further, a branch portion 10n is provided in the bus bar main body portion 10k of the low-voltage side input bus bar 33 to straddle the covering wall portion 10d3. One end of the branch portion 10m is soldered to the low-voltage side lead frame 10g of one of the buck-boost circuit power devices 21. Further, the other end of the branch portion 10m is soldered to the low-voltage side lead frame 10g of the other of the buck-boost circuit power devices 21.

The output bus bar 32 is a bus bar 10c that connects the motor and the power device 10a. The output bus bar 32 is provided so that the plate width direction (the width direction orthogonal to the current flowing direction and the plate thickness direction) of the bus bar main body portion 10k is aligned with the vertical direction. In the present embodiment, the output bus bar 32 is erected so that the direction along the plate width is aligned with the direction along the normal line of the surface of the water jacket 10e facing the power device 10a. In such output bus bar 32, the bus bar main body portion 10k is erected with respect to the water jacket 10e as described above. Accordingly, the installation space of the output bus bar 32 in plan view is extremely smaller than that in a case where the bus bar main body portion 10k is placed flat in parallel with the facing surface of the water jacket 10e.

In this manner, in the present embodiment, the bus bar main body portion 10k of the output bus bar 32 is erected and disposed between the power devices 10a having a rectangular shape in plan view as described above. Accordingly, the installation space of the input bus bar 31 in plan view can be reduced, and the shape of the power module 10 and further the power control unit 1 in plan view can be reduced.

The heat capacity of the output bus bar 32 is preferably large in order to suppress the heat generated by the power device 10a from being transferred to the outside. Accordingly, it is preferable that the lower end of the bus bar main body portion 10k of the output bus bar 32 is as close as possible to the facing surface of the water jacket 10e. Further, it is preferable that the upper end of the bus bar main body portion 10k of the output bus bar 32 is kept away from the water jacket 10e as much as possible. Accordingly, the lower end of the bus bar main body portion 10k of the output bus bar 32, for example, is disposed closer to the water jacket 10e than the height of the top surface of the power device 10a. Further, the upper end of the bus bar main body portion 10k of the output bus bar 32, for example, is disposed higher than the upper end position of the lead frame (the central lead frame 10f, the low-voltage side lead frame 10g, and the high-voltage side lead frame 10h).

Further, the bus bar main body portion 10k of the output bus bar 32 is disposed with respect to the water jacket 10e with only a bottom portion 10d2 of the insulating resin member 10d interposed therebetween. Accordingly, in the present embodiment, the heat of the output bus bar 32 easily escapes with respect to the water jacket 10e. Accordingly, the heat transferred from the power device 10a to the output bus bar 32 is absorbed by the water jacket 10e and can be prevented from being dissipated to the outside.

As shown in FIGS. 5A, 5B and 7, the bus bar main body portion 10k of the input bus bar 31, and the bus bar main body portion 10k of the output bus bar 32 are all included in the power module case 10b. The power module case 10b has the partition wall 10b1. Further, the partition wall 10b1 is disposed between the power device 10a and the power device 10a. For example, the bus bar main body portion 10k of the input bus bar 31, and the bus bar main body portion 10k of the output bus bar 32 are embedded in the partition wall 10b1.

Further, the external connection terminal portion 10j of the input bus bar 31 is a terminal portion connected to the capacitor 3. As shown in FIGS. 2 and 3, the external connection terminal portion 10*j* is provided so that the connection surface thereof faces upward. As described above, in the present embodiment, the external connection terminal portion 10*j*, which is the other end of the input bus bar 31, is disposed on one side of the power device 10*a* in the direction orthogonal to the arrangement direction of the power device 10*a*. Further, in the present embodiment, all the external connection terminal portions 10*j* of the input bus bar 31 are disposed on one side of the power module 10 with the power device 10*a* interposed therebetween. Accordingly, the capacitor 3 is disposed on the side of the power module 10, and the capacitor 3 and the external connection terminal portion 10*j* of the input bus bar 31 can be easily connected.

Further, in the present embodiment, the external connection terminal portion 10*j* of the input bus bar 31 is disposed outside the lead pin 10*i* in the direction orthogonal to the arrangement direction of the power device 10*a*. Accordingly, it is possible to prevent the external connection terminal portion 10*j* of the input bus bar 31 from being covered with the circuit board and to easily connect the capacitor 3 and the external connection terminal portion 10*j* of the input bus bar 31.

As shown in FIG. 3 or the like, the external connection terminal portions 10*j* of all the low-voltage side input bus bars 33 are disposed at the same height. Further, the external connection terminal portions 10*j* of all the high-voltage side input bus bars 34 are disposed at the same height. Further, the external connection terminal portion 10*j* of the low-voltage side input bus bar 33 is disposed above the external connection terminal portion 10*j* of the high-voltage side input bus bar 34. Accordingly, it is possible to easily distinguish between the external connection terminal portion 10*j* of the low-voltage side input bus bar 33 and the external connection terminal portion 10*j* of the high-voltage side input bus bar 34 based on the position in the height direction.

Further, the external connection terminal portion 10*j* of the output bus bar 32 is a terminal portion connected to the motor. As shown in FIG. 3, the external connection terminal portion 10*j* is provided so that the connection surface faces sideways. As described above, in the present embodiment, the external connection terminal portion 10*j*, which is the other end of the output bus bar 32, is disposed on the other side of the power device 10*a* in the direction orthogonal to the arrangement direction of the power device 10*a*. Further, in the present embodiment, all the external connection terminal portions 10*j* of the output bus bar 32 are disposed on one side of the power module 10 having the power device 10*a* interposed therebetween (one side opposite to the external connection terminal portion 10*j* of the input bus bar 31). Accordingly, the motor and the external connection terminal portion 10*j* of the output bus bar 32 can be easily connected.

Further, in the present embodiment, the external connection terminal portion 10*j* of the output bus bar 32 is disposed outside the lead pin 10*i* in the direction orthogonal to the arrangement direction of the power device 10*a*. Accordingly, it is possible to prevent the external connection terminal portion 10*j* of the output bus bar 32 from being covered with the circuit board and to easily connect the motor and the external connection terminal portion 10*j* of the output bus bar 32.

The insulating resin member 10*d* is an insulating material for preventing the conductors from being short-circuited with each other. The insulating resin member 10*d* includes the vertical wall 10*d*1, the bottom portion 10*d*2, the covering wall portion 10*d*3, a sheet-shaped portion 10*d*4 (see FIG. 7), or the like. The vertical wall 10*d*1 is disposed between the power devices 10*a*. The bottom portion 10*d*2 is disposed between the bus bar main body portion 10*k* of the bus bar 10*c* and the water jacket 10*e*. The covering wall portion 10*d*3 is provided between the buck-boost circuit power devices 21. The sheet-shaped portion 10*d*4 is inserted between the power device 10*a* and the water jacket 10*e*.

The water jacket 10*e* is disposed below the power device 10*a* and absorbs the heat generated by the power device 10*a*. The water jacket 10*e* includes atop plate portion. The top surface 10*e*1 of the top plate portion is a facing surface with respect to the power device 10*a*. Further, a plurality of fins 10*e*2 are provided on the back surface of the top plate portion. Such water jacket 10*e* is disposed to face the power device 10*a* with the sheet-shaped portion 10*d*4 of the insulating resin member 10*d* interposed therebetween.

In the present embodiment, when the power device 10*a* is driven and thus the power device 10*a* generates heat, the heat is transferred from the power device 10*a* to the bus bar 10*c*. The heat transmitted to the bus bar 10*c* is transmitted to the water jacket 10*e*. As a result, the heat of the power device 10*a* is suppressed from being transferred to the outside other than the water jacket 10*e*.

The power control unit 1 of the present embodiment has the power device 10*a*, the water jacket 10*e* disposed to face the power device 10*a* with the insulating resin member 10*d* interposed therebetween, and the plurality of plate-shaped bus bars 10*c* each of which has one end connected to the power device 10*a*. Further, the power control unit 1 of the present embodiment includes a plurality of input bus bars 31 connected to the input terminal of the power device 10*a* as the bus bar 10*c*. Further, the input bus bar 31 is erected so that the direction along the plate width is aligned with the direction along the normal line of the surface of the water jacket 10*e* facing the power device 10*a* and is disposed with respect to the water jacket 10*e* with the insulating resin member 10*d* interposed therebetween.

According to the power control unit 1 of the present embodiment, the input bus bar 31 is disposed with respect to the water jacket 10*e* with the insulating resin member 10*d* interposed therebetween. Accordingly, the heat transferred from the power device 10*a* to the input bus bar 31 is absorbed by the water jacket 10*e* and can be prevented from being dissipated to the outside. Further, in the power control unit 1 of the present embodiment, the direction along the plate width of the plate-shaped input bus bar 31 is aligned with the direction along the normal line of the surface of the water jacket 10*e* facing the power device 10*a*. Accordingly, the area of the input bus bar 31 in plan view is smaller than that in a case where the front and back surfaces of the input bus bar 31 are parallel to the facing surface. Accordingly, the installation area of the input bus bar 31 in plan view can be suppressed to be small, and the shape of the water jacket 10*e* in plan view can be reduced. Accordingly, according to the power control unit 1 of the present embodiment, it is possible to suppress the heat of the power device 10*a* from being transferred to the outside via the bus bar 10*c*, and to reduce the size of the shape of the power control unit 1 in plan view.

Further, the power control unit 1 of the present embodiment includes, as the input bus bar 31, the high-voltage side input bus bar 34 connected to the positive electrode of the power device 10*a*, and the low-voltage side input bus bar 33 connected to the negative electrode of the power device 10*a*. For example, a portion of the low-voltage side input bus bar 33 and a portion of the high-voltage side input bus bar 34 are disposed to be offset with an insulating material interposed therebetween. As a result, a portion of the low-voltage side input bus bar 33 and a portion of the high-voltage side input bus bar 34 are integrated with an insulating material interposed therebetween. Accordingly, the low-voltage side input bus bar 33 and the high-voltage side input bus bar 34 can be easily installed. Further, it is desirable that at least one of the high-voltage side input bus bar 34 and the low-voltage side input bus bar 33 is erected so that the direction along the plate width is aligned with the direction along the normal line of the surface of the water jacket 10e facing the power device 10a, and is disposed with respect to the water jacket 10e with the insulating resin member 10d interposed therebetween. By erecting at least one input bus bar 31 and bringing it closer to the water jacket 10e, the heat of the power device 10a can be efficiently transferred to the water jacket 10e.

Further, the power control unit 1 of the present embodiment includes the power module case 10b that holds the plurality of power devices 10a. Further, the power module case 10b has a partition wall 10b1 disposed between the power device 10a and the power device 10a. Further, the input bus bar 31 is erected so that the direction along the plate width is aligned with the direction along the normal line of the surface of the water jacket 10e facing the power device 10a. Further, the input bus bar 31 is embedded in the partition wall 10b1. By embedding the input bus bar 31 in the partition wall 10b1 in this way, it is not necessary to secure a dedicated disposition area for the embedded portion of the input bus bar 31. Accordingly, the shape of the power control unit 1 in plan view can be further miniaturized.

Further, in the power control unit 1 of the present embodiment, the power devices 10a are arranged in a row along one direction in a straight line. Further, an end portion of the input bus bar 31 is disposed on one side of the power device 10a in a direction orthogonal to the arrangement direction of the power device 10a. Further, on the other side of the power device 10a in the orthogonal direction, an end portion of the bus bar 10c having one end connected to the output end of the power device 10a is disposed. Accordingly, in the power control unit 1 of the present embodiment, it is not necessary to place the bus bar 10c flat in parallel with the facing surface of the water jacket 10e with respect to the power device 10a, and to arrange the plurality of power devices 10a on both sides of the input bus bar 31 that are placed flat. Accordingly, the installation space of the input bus bar 31 in plan view can be reduced, and the shape of the power module 10 and further the power control unit 1 in plan view can be reduced.

Further, the power control unit 1 of the present embodiment includes the capacitor 3 connected to the end portion of the input bus bar 31 on one side of the power device 10a in a direction orthogonal to the arrangement direction of the power device 10a. According to the power control unit 1 of the present embodiment as described above, the capacitor 3 can be disposed near the power device 10a, and the power loss between the power device 10a and the capacitor 3 can be reduced.

Second Embodiment

Next, a second embodiment of the present disclosure will be described. In the description of the second embodiment, the description of the same parts as those of the first embodiment will be omitted or simplified.

Figure 8:
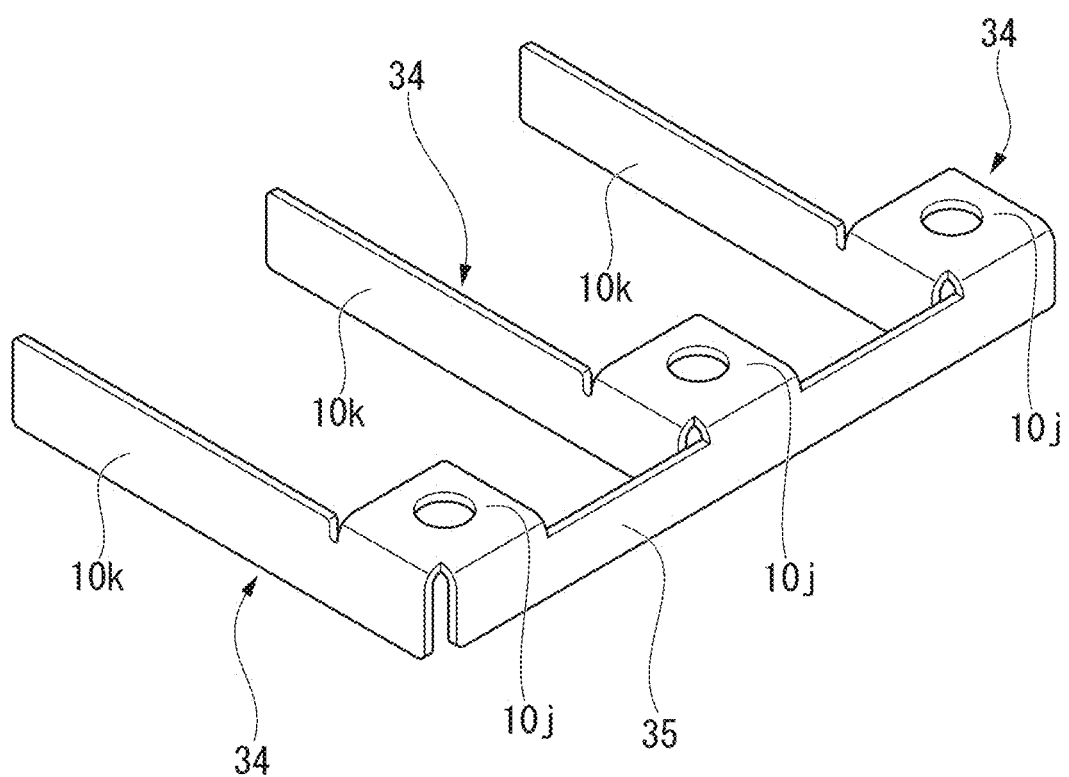
FIG. 8 is an enlarged perspective view including an external connection terminal portion of a high-voltage side input bus bar included in a power control unit according to the second embodiment of the present disclosure.

FIG. 8 is an enlarged perspective view including the external connection terminal portion 10j of the high-voltage side input bus bar 34 included in the power control unit of the second embodiment. As shown in FIG. 8, the power control unit of the present embodiment includes a connection bus bar 35 that connects the high-voltage side input bus bar 34.

The connection bus bar 35 is a bus bar 10c integrated with the high-voltage side input bus bar 34. The connection bus bar 35 is, for example, formed of the same material as the high-voltage side input bus bar 34. However, it is also possible to form the connection bus bar 35 with a material different from that of the high-voltage side input bus bar 34.

By providing such connection bus bar 35, it is possible to more reliably prevent the heat of the power device 10a from being transferred to the capacitor 3 by utilizing the heat capacity of the connection bus bar 35. That is, although the heat generation amount of the power device 10a temporarily increases and the heat capacity of the high-voltage side input bus bar 34 reaches the upper limit, the heat can be stored in the connection bus bar 35. Accordingly, when the heat generation amount of the power device 10a is reduced, the stored heat can be transferred to the water jacket 10e, and the heat can be prevented from being transferred to the outside. Further, a plurality of high-voltage side input bus bars 34 are connected by the connection bus bar 35. Accordingly, the current of the high-voltage side input bus bar 34 is smoothed, and the current density flowing through the capacitor 3 can be reduced.

As shown in FIG. 8, the connection bus bar 35 has a plate shape and is disposed to align the direction along the plate width with the vertical direction, similarly to the bus bar main body portion 10k of the high-voltage side input bus bar 34. That is, the connection bus bar 35 is provided so that the direction along the plate width is aligned with the direction along the normal line of the surface of the water jacket 10e facing the power device 10a.

By disposing the connection bus bars 35 in the vertical direction along the plate width in this way, it is possible to suppress the installation space of the connection bus bars 35 in plan view. Further, it is possible to suppress the increase in size of the power module 10 by providing the connection bus bar 35.

In the above description, the configuration in which the connection bus bar 35 is connected to the plurality of high-voltage side input bus bars 34 is described. Similarly, it is also possible to connect the connection bus bar 35 to a plurality of low-voltage side input bus bars 33.

Third Embodiment

Next, a third embodiment of the present disclosure will be described. In the description of the third embodiment, the description of the same parts as those of the first embodiment will be omitted or simplified.

Figure 9:
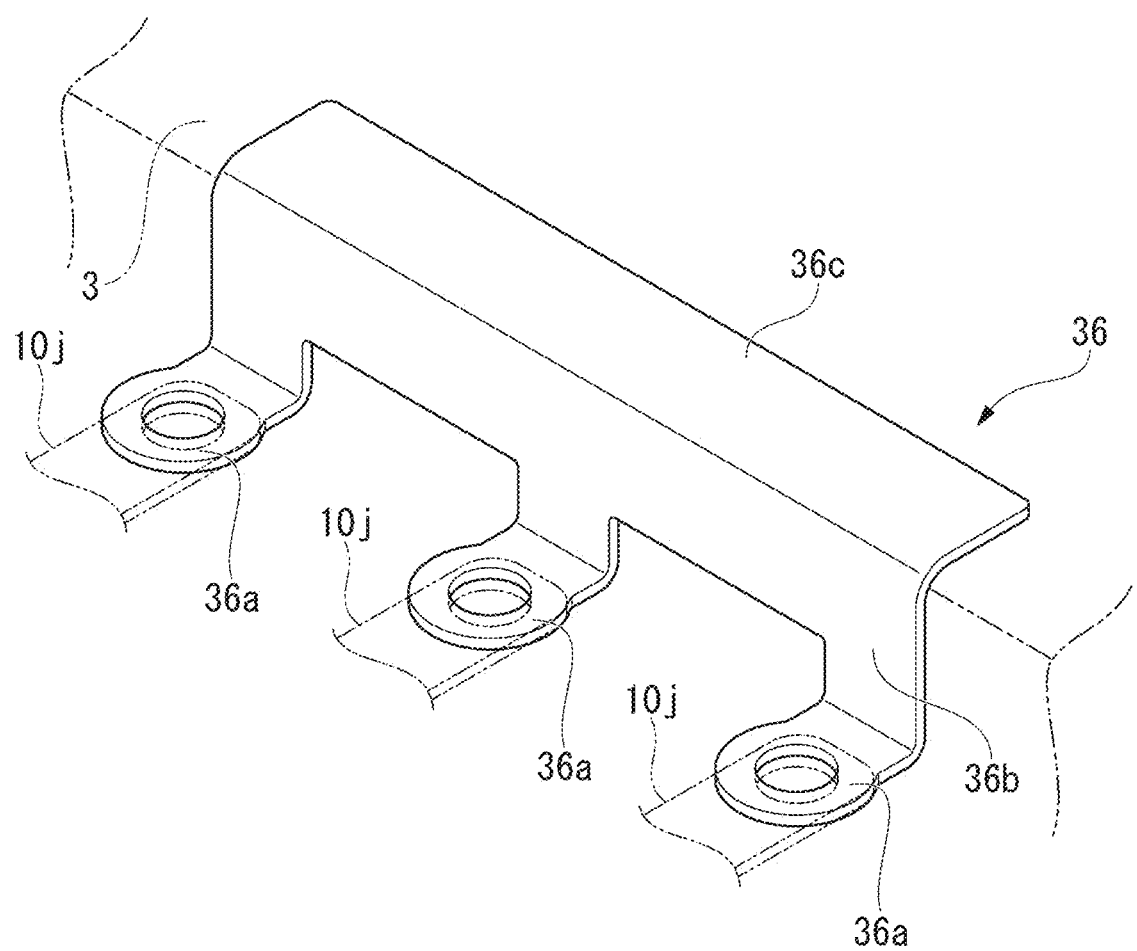
FIG. 9 is a perspective view of a connection bus bar included in a power control unit according to a third embodiment of the present disclosure.

FIG. 9 is a perspective view of a connection bus bar 36 included in a power control unit of the third embodiment. The connection bus bar 36 is a bus bar 10c that connects the low-voltage side input bus bars 33 to each other and is separate from the low-voltage side input bus bar 33.

As shown in FIG. 9, the connection bus bar 36 includes a fastening piece 36a, a connecting piece 36b, and a mounting piece 36c. The fastening piece 36a is a portion to be fastened to the external connection terminal portion 10j of the low-voltage side input bus bar 33. The fastening piece 36a is provided for each low-voltage side input bus bar 33 connected by the single connection bus bar 36. The connecting piece 36b is a portion that is stretched in the horizontal direction and connects the fastening pieces 36a to each other. The mounting piece 36c is a plate-shaped portion protruding from the upper edge of the connecting piece 36b to the side opposite to the fastening piece 36a. The mounting piece 36c is a portion that is brought into contact with the top surface of the capacitor 3 from above.

The connection bus bar 36 is fastened together with the external connection terminal portion 10j by a fastener (not shown) for fastening the terminal of the capacitor 3 and the external connection terminal portion 10j of the low-voltage side input bus bar 33. Specifically, the fastening piece 36a of the connection bus bar 36 is fastened together with the external connection terminal portion 10j. Further, the connection bus bar 36 is supported by the capacitor 3 by mounting the mounting piece 36c on the top surface of the capacitor 3.

Such a power control unit of the present embodiment includes the connection bus bar 36 connecting a plurality of input bus bars 31 as the bus bar 10c. Accordingly, it is possible to more reliably prevent the heat of the power device 10a from being transferred to the capacitor 3 by utilizing the heat capacity of the connection bus bar 36. That is, although the heat generation amount of the power device 10a temporarily increases and the heat capacity of the low-voltage side input bus bar 33 reaches the upper limit, the heat can be stored in the connection bus bar 36. Accordingly, when the heat generation amount of the power device 10a is reduced, the stored heat can be transferred to the water jacket 10e, and the heat can be prevented from being transferred to the outside. Further, the plurality of low-voltage side input bus bars 33 are connected by the connection bus bar 36. Accordingly, the current of the low-voltage side input bus bar 33 is smoothed, and the current density flowing through the capacitor 3 can be reduced.

Further, in the power control unit of the present embodiment, the connection bus bar 36 is separate from the input bus bar 31. Accordingly, the shape of the connection bus bar 36 can be set independently of the input bus bar 31. Accordingly, according to the connection bus bar 36 in the present embodiment, it is possible to include the mounting piece 36c to be mounted on the capacitor 3.

Further, in the power control unit of the present embodiment, the connection bus bar 36 is fastened to the other end (the external connection terminal portion 10j) of the input bus bar 31. Accordingly, it is not necessary to separately provide the input bus bar 31 with a portion for fastening the connection bus bar 36, and it is possible to prevent the shape of the input bus bar 31 from becoming complicated.

Further, in the power control unit of the present embodiment, the connection bus bar 36 is supported by the capacitor 3. Accordingly, the connection bus bar 36 can be stably supported.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

EXPLANATION OF REFERENCES

1 Power control unit
3 Capacitor (electrical component)
4 Reactor
10 Power module
10a Power device
10b Power module case
10b1 Partition wall
10c Bus bar
10d Insulating resin member
10d1 Vertical wall
10d2 Bottom portion
10d3 Covering wall portion
10d4 Sheet-shaped portion
10e Water jacket (heat dissipation member)
10e1 Top surface
10e2 Fin
10i Lead pin
10j External connection terminal portion
10k Bus bar main body portion
10m Branch portion
11 Circuit board
21 Buck-boost circuit power device
22 Inverter circuit power device
31 Input bus bar
32 Output bus bar
33 Low-voltage side input bus bar
34 High-voltage side input bus bar
35 Connection bus bar
36 Connection bus bar
36a Fastening piece
36b Connecting piece
36c Mounting piece
B Base member
B1 First conductor substrate
B2 Second conductor substrate
Ba Portion
C Semiconductor chip
Pb Connection pad

What is claimed is:

1. A power control unit comprising:
   a power device;
   a heat dissipation member disposed to face the power device with an insulating resin member interposed therebetween; and
   a plurality of plate-shaped bus bars each of which has one end connected to the power device, wherein
   a plurality of input bus bars connected to an input terminal of the power device are provided as the plurality of plate-shaped bus bars,
   at least one of the plurality of input bus bars is erected so that a direction along a plate width is aligned with a direction along a normal line of a surface of the heat dissipation member facing the power device and is disposed with respect to the heat dissipation member with the insulating resin member interposed therebetween,
   a high-voltage side input bus bar connected to a positive electrode of the power device is provided as one of the plurality of input bus bars,
   a low-voltage side input bus bar connected to a negative electrode of the power device is provided as one of the plurality of input bus bars, and
   at least one input bus bar of the high-voltage side input bus bar and the low-voltage side input bus bar is erected so that the direction along the plate width is aligned with the direction along the normal line of the surface of the heat dissipation member facing the power device and is disposed with respect to the heat dissipation member with the insulating resin member interposed therebetween.

2. The power control unit of claim 1, wherein a connection bus bar which connects the plurality of input bus bars is provided as the plurality of plate-shaped bus bars.

3. The power control unit of claim 2, wherein the plurality of input bus bars and the connection bus bar are integrated.

4. The power control unit of claim 2, wherein the connection bus bar is separate from the plurality of input bus bars.

5. The power control unit of claim 4, further comprising an electrical component to which the other end of the plurality of input bus bars is fastened, wherein the connection bus bar is fastened together with the other end of the plurality of input bus bars.

6. The power control unit of claim 4, further comprising an electrical component to which the other end of the plurality of input bus bars is fastened, wherein the connection bus bar is supported by the electrical component.

7. The power control unit of claim 2, wherein the connection bus bar is provided so that the direction along the plate width is aligned with the direction along the normal line of the surface of the heat dissipation member facing the power device.

8. The power control unit of claim 1, further comprising a power module case holding a plurality of the power devices, wherein
the power module case has a partition wall disposed between a first power device of the plurality of the power devices and a second power device of the plurality of the power devices adjacent to the first power device, and
the plurality of input bus bars, which is erected so that the direction along the plate width is aligned with the direction along the normal line of the surface of the heat dissipation member facing the power devices, is embedded in the partition wall.

9. The power control unit of claim 8, wherein
the power devices are arranged in a row along one direction in a straight line,
the other end of the plurality of input bus bars is disposed on one side of the power devices in a direction orthogonal to an arrangement direction of the power devices, and
the other end of the plurality of plate-shaped bus bars having one end connected to an output end of the power devices is disposed on the other side of the power devices in the orthogonal direction.

10. The power control unit of claim 9, further comprising a capacitor connected to the other end of the plurality of input bus bars on the one side of the power devices in the direction orthogonal to the arrangement direction of the power devices.

* * * * *